US009281607B2

(12) United States Patent
Lee et al.

(10) Patent No.: US 9,281,607 B2
(45) Date of Patent: Mar. 8, 2016

(54) ELECTRONIC CONTROL DEVICE FOR VEHICLE

(71) Applicant: Hyundai Autron Co., Ltd., Seongnam-si (KR)

(72) Inventors: Dong Gi Lee, Incheon (KR); Man Ho Seok, Seongnam-si (KR); Seung Mok Song, Seongnam-si (KR); Wan Kyu Lee, Yongin-si (KR); Jun Ho Lee, Seoul (KR); Yeon Chul Choo, Seoul (KR); Chang Ju Kim, Uijeongbu-si (KR); Hyung Joon Moon, Seoul (KR); Chang Geun Shin, Yongin-si (KR); Sun Jae Yang, Gunpo-si (KR); Ju Hyung Lee, Suwon-si (KR)

(73) Assignee: HYUNDAI AUTRON CO., LTD., Seongnam-Si (KR)

(*) Notice: Subject to any disclaimer, the term of this patent is extended or adjusted under 35 U.S.C. 154(b) by 101 days.

(21) Appl. No.: 14/129,104

(22) PCT Filed: Dec. 4, 2013

(86) PCT No.: PCT/KR2013/011161
§ 371 (c)(1),
(2) Date: Dec. 23, 2013

(87) PCT Pub. No.: WO2014/088313
PCT Pub. Date: Jun. 12, 2014

(65) Prior Publication Data
US 2015/0146347 A1    May 28, 2015

(30) Foreign Application Priority Data
Dec. 5, 2012    (KR) .................... 10-2012-0139979

(51) Int. Cl.
*H01R 13/52*    (2006.01)
*H05K 5/00*    (2006.01)
(Continued)

(52) U.S. Cl.
CPC .......... *H01R 13/5202* (2013.01); *H05K 5/0052* (2013.01); *H05K 5/0056* (2013.01); *H05K 5/061* (2013.01); *H05K 5/062* (2013.01); *B60R 16/0239* (2013.01); *H01R 2201/26* (2013.01)

(58) Field of Classification Search
CPC ............................ H01R 13/5202; H05K 5/061
See application file for complete search history.

(56) References Cited

U.S. PATENT DOCUMENTS 6,309,257 B1 * 10/2001 Huang ........................... 439/731
6,343,953 B2 *  2/2002 Nakamura et al. ............ 439/589
(Continued)

FOREIGN PATENT DOCUMENTS

| JP | 2007-234429 A | 9/2007 |
| JP | 2009-070855 A | 4/2009 |
| KR | 20-2011-0002790 U | 3/2011 |

OTHER PUBLICATIONS

International Search Report for International Application No. PCT/KR2013/011161, Feb. 4, 2014, Korean Intellectual Property Office, Korea.

*Primary Examiner* — James Harvey
(74) *Attorney, Agent, or Firm* — Mayer Brown LLP; Hyunho Park

(57) ABSTRACT

The present invention relates to an electronic control device which is an electronic control device such as an engine ECU for a vehicle and has a tight sealing structure between a case and a connector. The present invention provides an electronic control device for a vehicle, which implements a new type of sealing manner in which a space to be filled with a sealing material is formed between a case side dam and a connector side dam when a case and a connector of the electronic control device are assembled, and the sealing material is applied in the space, which is formed as described above, such that airtightness for an assembly region between the case and the connector is maintained, thereby securing sufficient sealing areas because of enlarged sealing sections, and achieving stable sealing quality and improving quality.

7 Claims, 9 Drawing Sheets

(51) Int. Cl.
*H05K 5/06* (2006.01)
*B60R 16/023* (2006.01)

(56) References Cited

U.S. PATENT DOCUMENTS

| | | | |
|---|---|---|---|
| 6,407,925 B1 * | 6/2002 | Kobayashi et al. | 361/752 |
| 6,561,522 B1 * | 5/2003 | Radelet et al. | 277/628 |
| 6,573,448 B2 * | 6/2003 | Mayer et al. | 174/481 |
| 8,657,609 B2 * | 2/2014 | Yanagisawa et al. | 439/79 |
| 8,687,374 B2 * | 4/2014 | Watanabe et al. | 361/752 |
| 8,770,989 B2 * | 7/2014 | Ohhashi et al. | 439/76.1 |
| 8,942,001 B2 * | 1/2015 | Kawai et al. | 361/752 |
| 2001/0039130 A1 * | 11/2001 | Nakamura et al. | 439/76.1 |
| 2007/0218715 A1 | 9/2007 | Itou et al. | |
| 2009/0068862 A1 * | 3/2009 | Honda | 439/78 |
| 2009/0129035 A1 * | 5/2009 | Kojima | 361/752 |
| 2012/0069532 A1 * | 3/2012 | Azumi et al. | 361/752 |
| 2014/0080329 A1 * | 3/2014 | Yamanaka et al. | 439/76.1 |
| 2014/0087792 A1 * | 3/2014 | Park | 455/575.1 |
| 2014/0334115 A1 * | 11/2014 | Yang et al. | 361/752 |
| 2014/0334116 A1 * | 11/2014 | Lee et al. | 361/752 |
| 2015/0035418 A1 * | 2/2015 | Shiu | 312/223.1 |

* cited by examiner

ELECTRONIC CONTROL DEVICE FOR VEHICLE

TECHNICAL FIELD

The present invention relates to an electronic control device for a vehicle, and more particularly, to an electronic control device such as an engine ECU for a vehicle which has a tight sealing structure between a case and a connector.

BACKGROUND ART

In general, an electronic control device such as an electronic control unit (ECU), which electronically controls various types of devices, is equipped in a vehicle. The electronic control device receives information from sensors or switches that are installed at each part of the vehicle, and serves to perform various electronic controls for promoting improvement of a riding quality and safety of the vehicle or providing various items of convenience to a driver and a passenger by processing the received information.

The electronic control device controls states of an engine, an automatic transmission, an ABS, and the like in the vehicle using a computer. It has been growing to control all parts in the vehicle through the electronic control device, such as a driving system, a braking system, a steering system, the automatic transmission, as the computer have been developed in terms of performance.

The electronic control device such as the ECU has a structure that includes a case which includes an upper cover and a lower base, a PCB which is accommodated in the case, a connector which is coupled to a front end of the PCB so as to be connected to an external socket, and the like.

Further, the case has a structure in which the cover and the base are assembled together with the PCB while covering the PCB, and particularly, the connector, which is interposed between the cover and the base when the cover and the base are assembled, forms a sealing structure with the cover side and the base side.

The electronic control device has a high integrated control circuit means, and thus requires a predetermined sealing structure that may prevent external moisture or foreign substances from flowing into the electronic control device, and the electronic control device mainly adopts a sealing structure in which the cover and the base are typically assembled together with the connector in a state in which sealing materials are inserted on binding parts between the cover and the base and the connector so as to protect the PCB and the like in the electronic control device.

For example, U.S. Pat. No. 6,573,448 discloses "a technology having a structure which includes a housing, and a sealing member for coupling the housing and a plug body, in which the sealing member is interposed between a protrusion of the plug body and a groove of the housing".

In addition, Japanese Patent No. 4470980 discloses "a technology having a structure which includes upper and lower cases, a printed circuit board, a connector, and a waterproof material, in which the waterproof material is interposed between groove portions of the upper and lower cases".

Further, U.S. Pat. No. 7,744,381 discloses "a technology having a structure which includes a sealing member for coupling a printed circuit board, a connector, and a case, in which the sealing member is interposed between grooves of the case".

However, the sealing structures, which are applied to the electronic control device in the related art, are mostly configured as a structure in which a sealing member is applied on binding regions between grooves or projections at a connector side, or between projections or grooves at a cover side and a base side, and as a result, it is difficult to secure sealing quality for assembling regions between the connector, and the cover and the base because of an insufficient sealing area.

Technical Problem

The present invention has been made in consideration of the aforementioned problems, and an object of the present invention is to provide an electronic control device for a vehicle, which implements a new type of sealing manner in which a space to be filled with a sealing material is formed between a case side dam and a connector side dam when a case and a connector of the electronic control device are assembled, and the sealing material is applied in the space, which is formed as described above, such that airtightness for an assembly region between the case and the connector is maintained, thereby securing sufficient sealing areas because of enlarged sealing sections, and achieving stable sealing quality and improving quality.

Technical Solution

In order to achieve the aforementioned object, an electronic control device for a vehicle provided by the present invention has the following features.

The electronic control device has an electronic control element that electrically controls each part of a vehicle, and basically includes a cover and a base which accommodate the electronic control element, and a connector which is coupled to front surfaces of the cover and the base, and particularly, includes a sealing structure in which protrusions are formed along an outer periphery of a rear end portion of the connector and inner peripheries of front end portions of the cover and the base which come into contact with the outer periphery, the protrusions maintain predetermined gap, and a sealing member is applied in the gap between the protrusions.

Therefore, in the electronic control device, sealing is made at portions where surfaces of the cover and the base meet surfaces of the connector such that sufficient sealing sections are secured, thereby tightly coupling the cover and the base, and the connector.

Particularly, the protrusion of the connector may have an inner surface which faces the protrusions of the cover and the base and is formed as an inclined surface, and the protrusions of the cover and the base may have inner surfaces which face the protrusion of the connector and are formed as curved surfaces, thereby securing larger sealing sections (sealing areas).

Here, at least one surface or both surfaces of the surfaces of the connector side and the surfaces of the cover side and the base side, which face each other in the spaces that are formed between the protrusion of the connector and the protrusions of the cover and the base, may be formed as a recessed portion, thereby securing additional sealing sections (sealing areas).

Further, sealing between the cover and the base may be made by applying the sealing member on a binding surface between a groove and a projection, which are formed along edges where the cover and the base come into contact with each other.

Advantageous Effects

The sealing structure of the electronic control device for a vehicle provided by the present invention has the following advantages.

Firstly, sealing is made in a manner in which dams, which maintains a predetermined interval, are formed on a binding region between an upper cover and a connector, and a binding region between a lower base and the connector when the case and the connector are assembled, and a sealing material is applied in a space between the dams, which are formed as described above, thereby securing a sufficient sealing area, achieving stable sealing quality, and ultimately protecting internal components of the electronic control device safely.

Secondly, when the sealing material is applied, the sealing material is confined in the space that is formed between the dams, such that the sealing material does not flow to the outside, thereby maintaining a clean external appearance at the sealing regions, and improving product quality.

Figure 1:
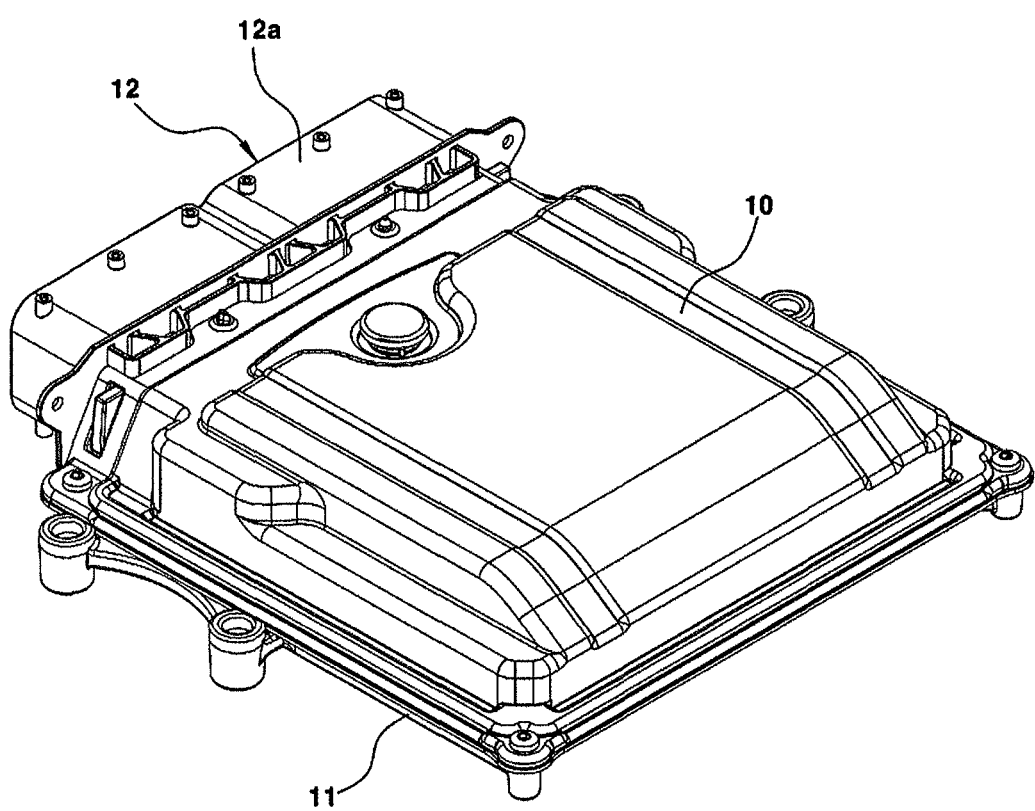
FIGS. 1 and 2 are coupled perspective views illustrating an electronic control device for a vehicle according to an exemplary embodiment of the present invention.

DESCRIPTION OF MAIN REFERENCE
NUMERALS OF DRAWINGS

10: Cover
11: Base
12: Connector
12a: Front end body portion
12b: Rear end body portion
13a, 13b: protrusion
14: Sealing member
15: Inclined surface
16: Curved surface
17: Recessed portion
18a: Groove
18b: Projection
19: Inner pin
20: Outer pin
21: Vertical surface

BEST MODE

Hereinafter, the present invention will be described in detail with reference to the accompanying drawings.

Figure 2:
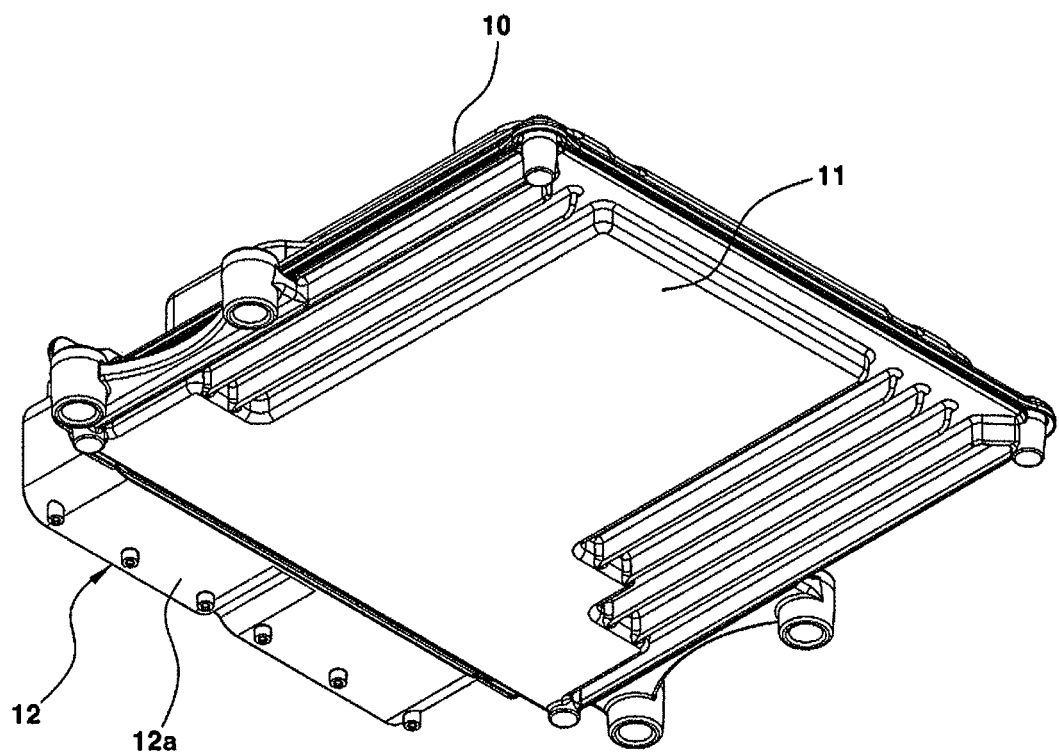
Figure 3:
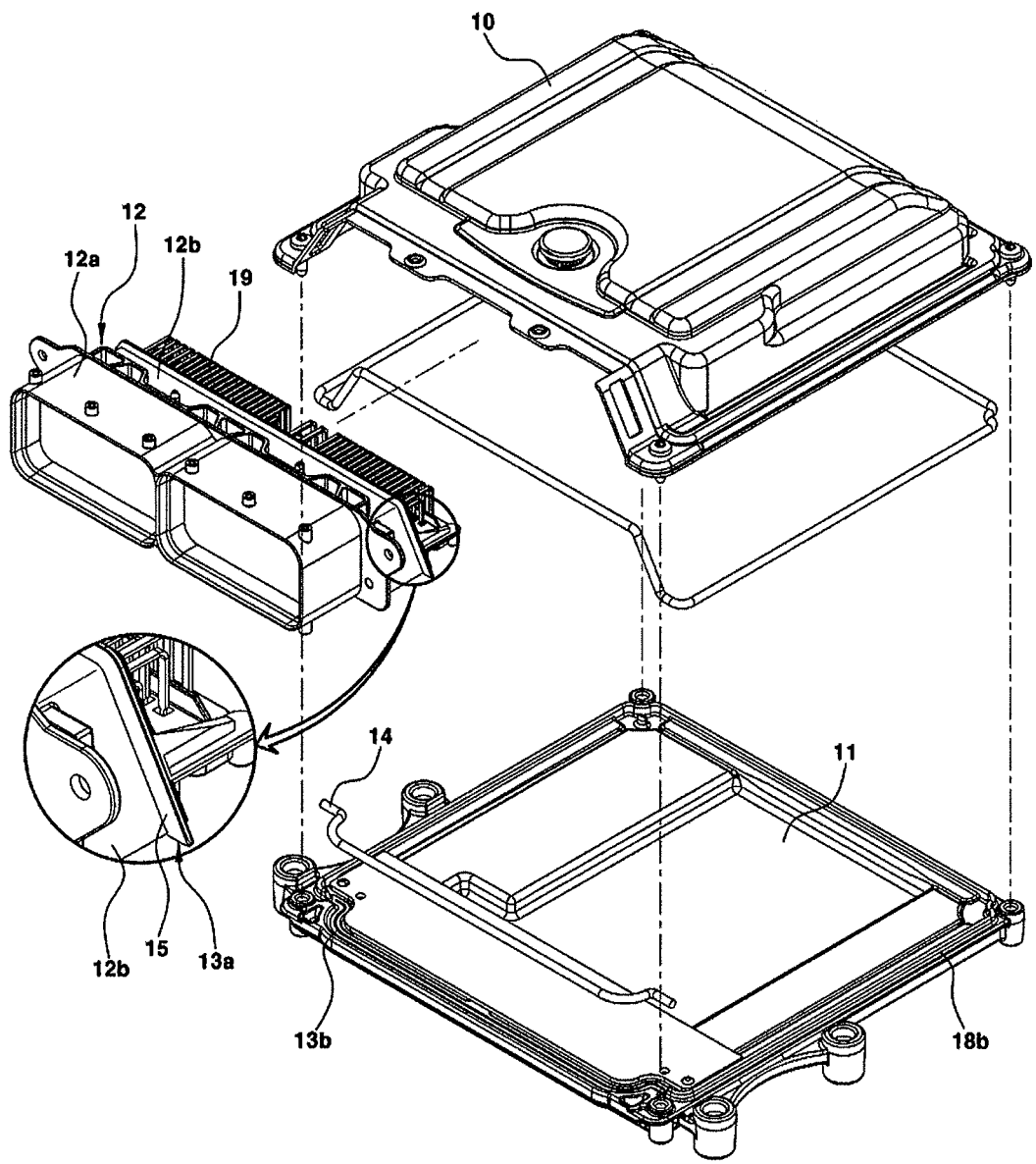
FIGS. 3 and 4 are exploded perspective views illustrating the electronic control device for a vehicle according to the exemplary embodiment of the present invention.
Figure 4:
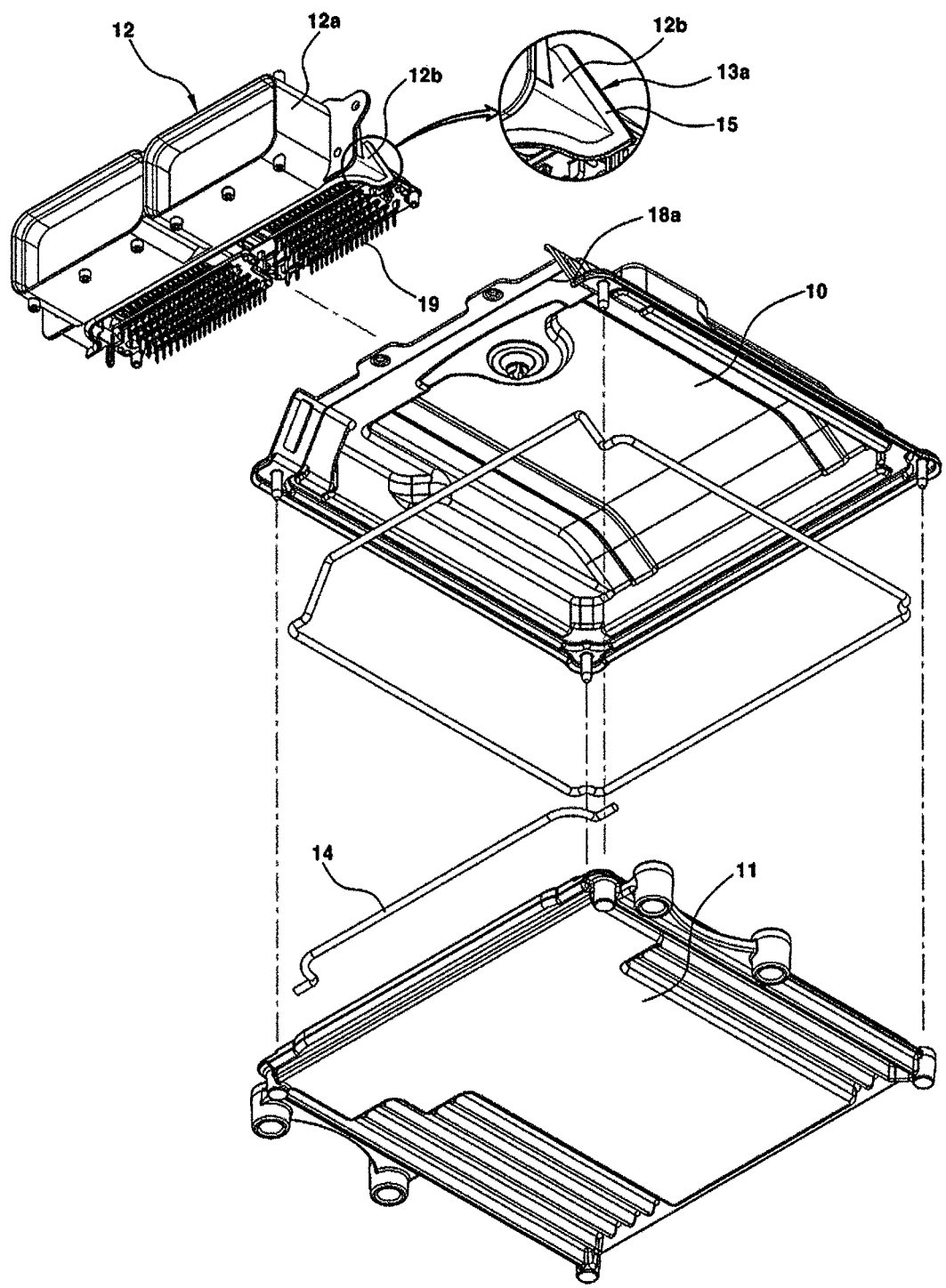
Figure 5:
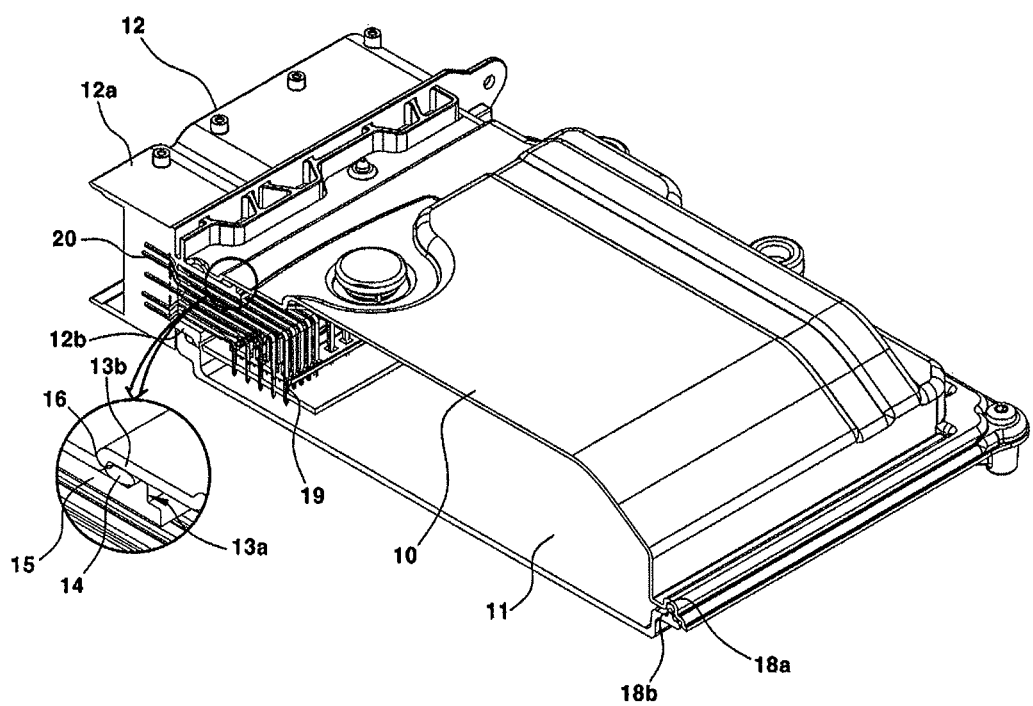
FIGS. 5 and 6 are cross-sectional perspective views illustrating the electronic control device for a vehicle according to the exemplary embodiment of the present invention.
Figure 6:
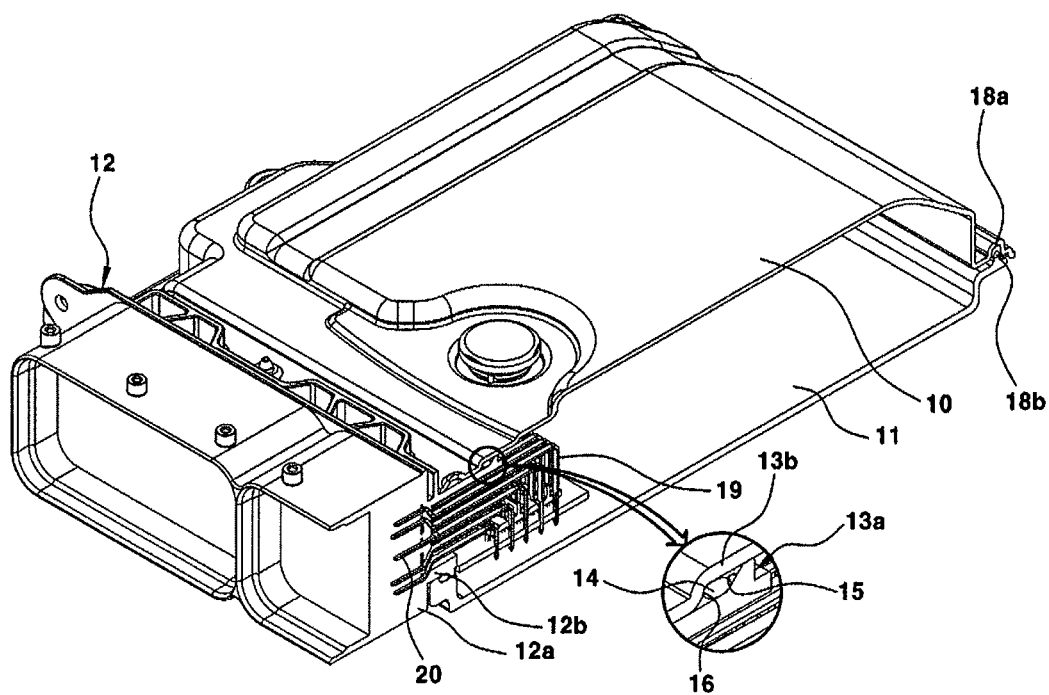

FIGS. 1 and 2 are coupled perspective views illustrating an electronic control device for a vehicle according to an exemplary embodiment of the present invention, FIGS. 3 and 4 are exploded perspective views illustrating the electronic control device for a vehicle according to the exemplary embodiment of the present invention, and FIGS. 5 and 6 are cross-sectional perspective views illustrating the electronic control device for a vehicle according to the exemplary embodiment of the present invention.

As illustrated, the electronic control device refers to a component having an electronic control element, for example, integrated control circuit means, such as a printed circuit board (PCB), which electrically controls each part of a vehicle, and requires a tight sealing structure so as to prevent external moisture or foreign substances from flowing into the electronic control device.

To this end, a cover 10 and a base 11, which are combined with each other in an up and down direction while accommodating a PCB therein, are provided, and a connector 12 is coupled to front portions of the cover 10 and the base 11 which are combined as described above.

That is, the connector 12 is coupled together with the cover 10 and the base 11 while being interposed between the cover 10 and the base 11 through a rear end body portion when the cover 10 and the base 11 are coupled to each other in the up and down direction.

The connector 12 has a plurality of inner pins 19 for connection to the PCB in the electronic control device, and a plurality of outer pins 20 for connection to the exterior, and includes a front end body portion 12a, which is exposed to the outside, and a rear end body portion 12b, which are integrally formed with each other, and the connecter 12 may be coupled together with the cover 10 and the base 11 which coming into contact with inner sides of edges of front end portions of the cover 10 and the base 11 through the rear end body portion 12b.

Accordingly, the connector 12, and the cover 10 and the base 11 come into contact with each other at a portion where the rear end body portion 12b of connector 12 is placed, and thereby, the connector 12, and the cover 10 and the base 11 may be tightly sealed.

Particularly, the present invention provides a sealing structure in which the sealing between the connector 12, and the cover 10 and the base 11 is made at portions where surfaces of the connector 12 meet surfaces of the cover 10 and the base 11, that is, portions where the connector 12, and the cover 10 and the base 11 come into contact with each other side by side while facing each other at the upper and lower sides and the left and right sides when the connector 12, and the cover 10 and the base 11 are coupled to each other.

According to this surface to surface type sealing structure, sufficient sealing sections (sealing areas) may be secured, and sealing functions may be improved because of the enlarged sealing section, thereby achieving stable sealing quality.

To this end, a protrusion 13a having a band shape protrudes at an outer periphery of a rear end portion of the connector 12, that is, at an outer periphery of the rear end body portion 12b so as to be continuous over the entire peripheral section, and protrusions 13b, which have a stepped shape and correspond to the protrusion 13a, are formed at inner peripheries of front end portions of the cover 10 and the base 11, that is, at inner peripheries, which come into contact with the rear end body portion 12b of the connector 12, so as to be continuous over the entire peripheral section.

Further, the protrusion 13a of the connector 12 and the protrusions 13b of the cover 10 and the base 11 may be positioned while maintaining predetermined gap therebetween in a front and rear longitudinal direction on the basis of a state in which the connector 12 is coupled to the cover 10 and the base 11.

Therefore, predetermined spaces, which correspond to a distance between the front protrusion 13a and the rear protrusions 13b, that is, spaces, which have a cross section that is enclosed by the protrusions 13a and 13b in front and rear directions, and by the surfaces of the cover 10 and the base 11 and the surfaces of the connector 12 in up and down directions or in left and right directions, may be formed between the front protrusion 13a at the connector side and the rear protrusions 13b at the cover side and the base side, and as a result, a sealing member 14 is applied in the spaces, which are formed as described above, such that sealing is made between the connector 12, and the cover 10 and the base 11.

That is, since the sealing is made while the sealing member 14 is applied at the portions where the surfaces (front surfaces of the protrusions in the spaces) of the connector 12 meet the surfaces (rear surfaces of the protrusions in the spaces) of the cover 10 and the base 11, sealing sections having a relatively larger area may be secured in comparison with the existing structure in which a sealing member is applied at a binding region between a groove and a projection, and as a result, stable sealing quality may be achieved because of the enlarged sealing section.

Further, the sealing member 14 applied in the spaces is blocked by the front and rear protrusions 13a and 13b so as not to flow to the outside.

Accordingly, the sealing member 14 applied in the spaces may perfectly block the internal spaces of the cover 10 and the base 11 from the outside over the entire peripheral section of the sealing regions while maintaining a predetermined width, thereby securing stable sealing performance and also improving application quality because no sealing member 14 flows to the outside.

Meanwhile, the present invention provides sealing structures having various shapes in order to secure larger sealing areas.

Figure 7:
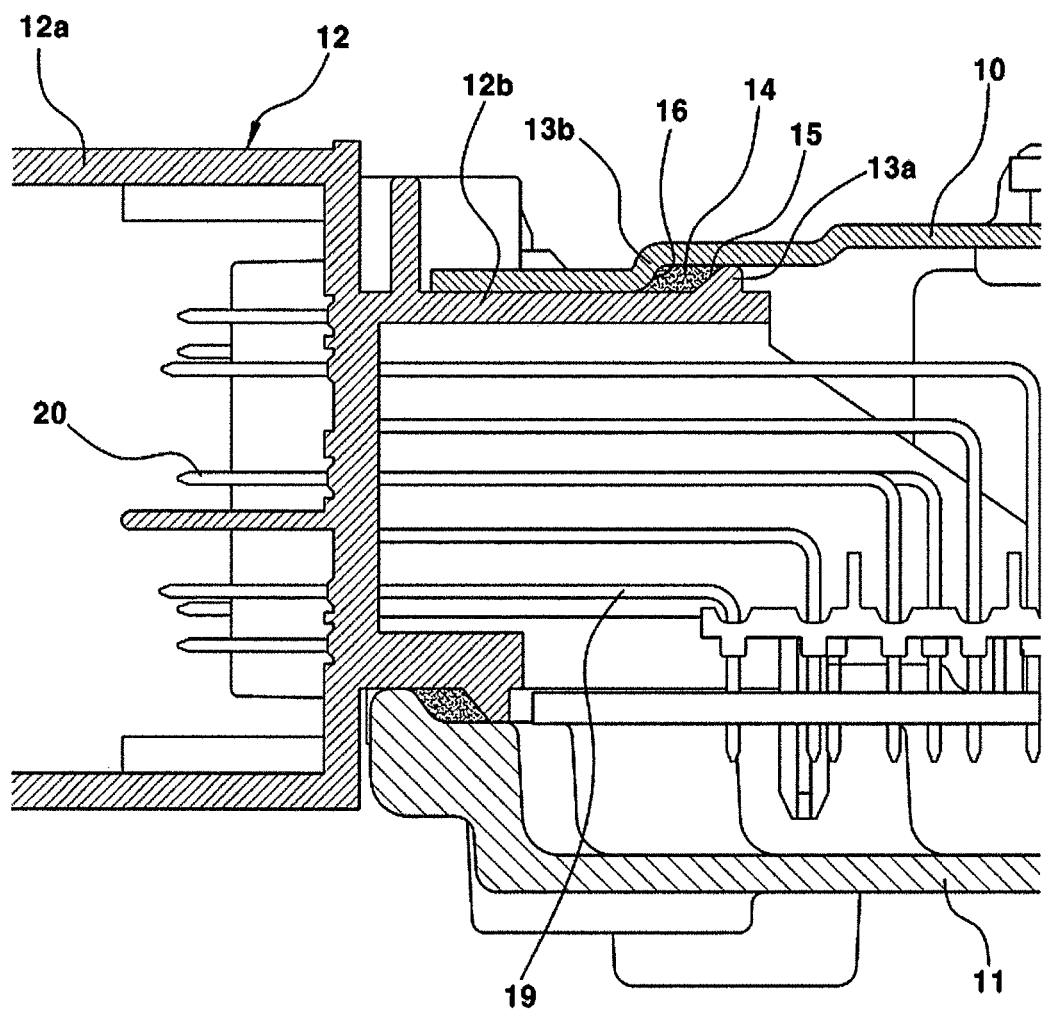
FIGS. 7 to 9 are cross-sectional views illustrating several examples of sealing structures between a connector, a cover, and a base in the electronic control device for a vehicle according to the exemplary embodiment of the present invention.
Figure 8:
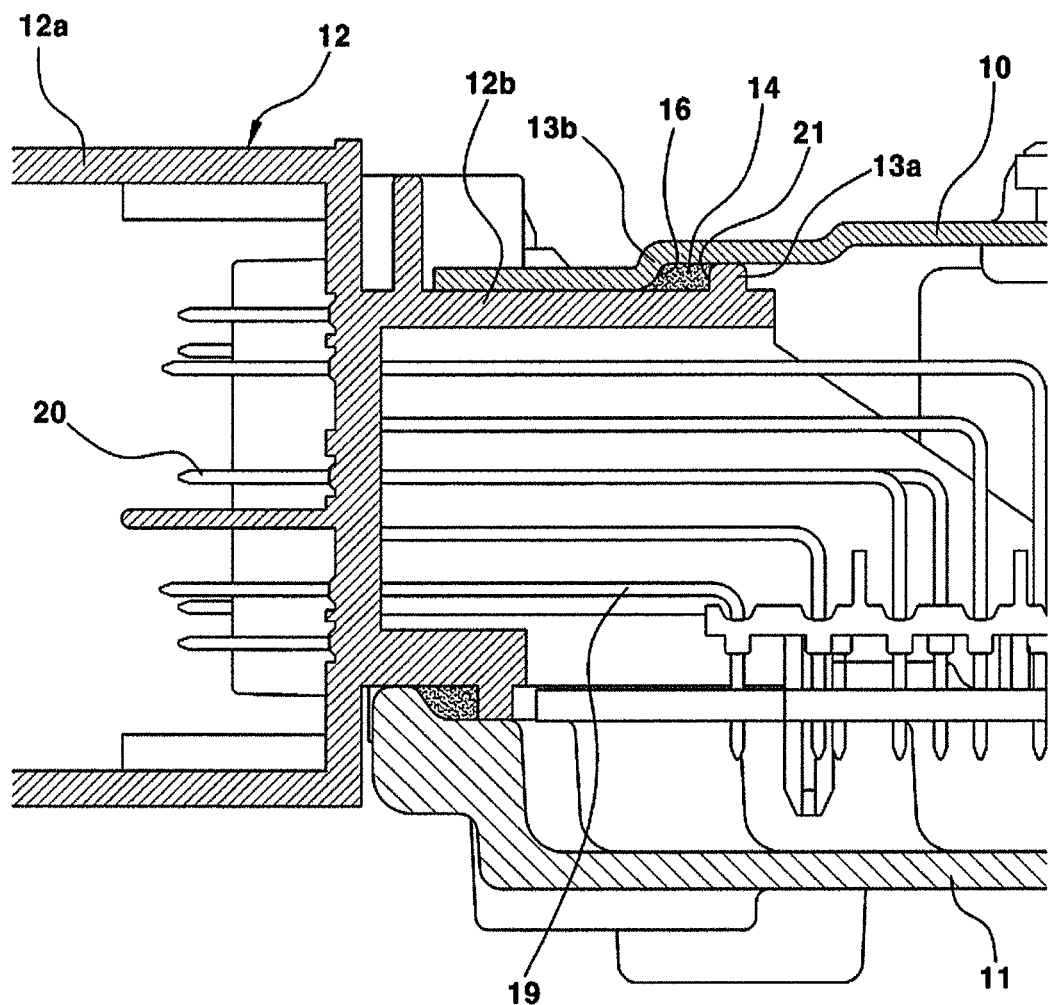
Figure 9:
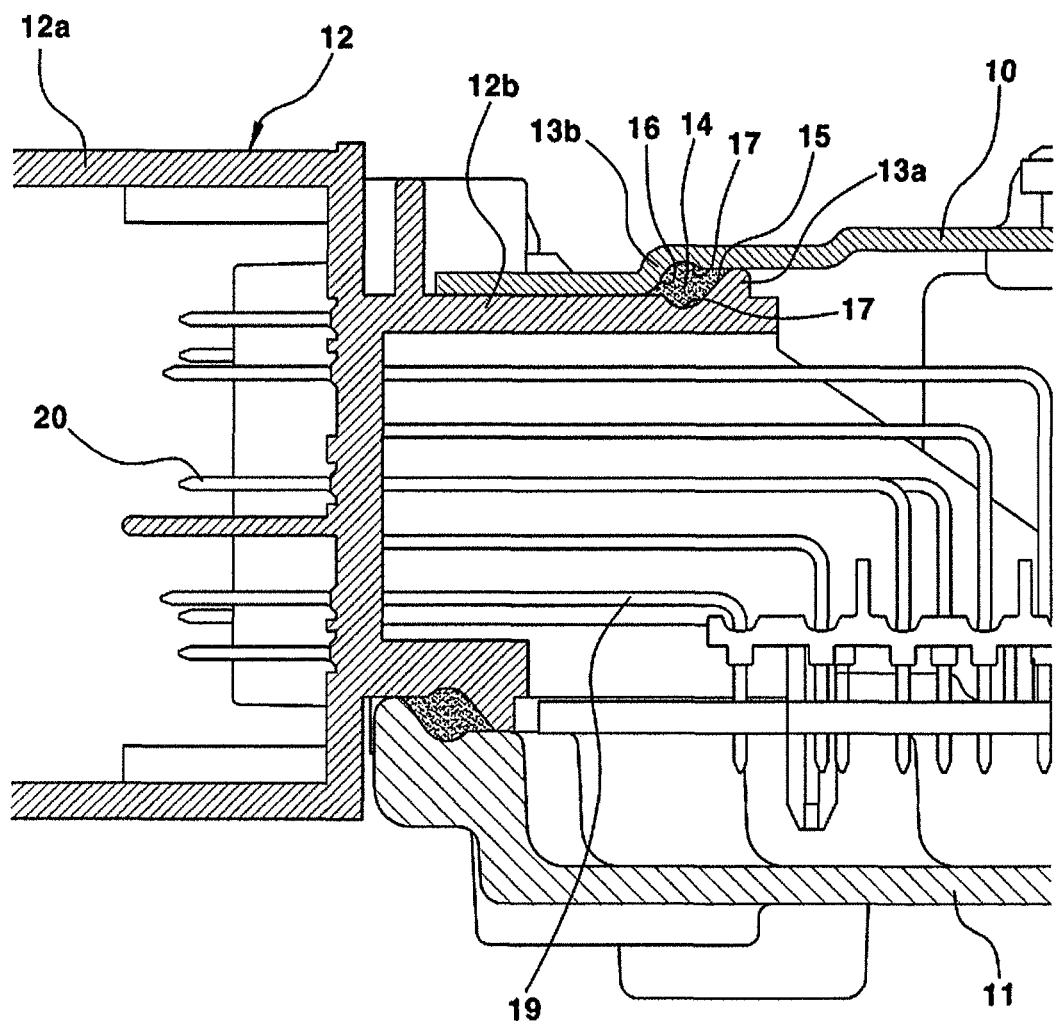

For example, as illustrated in FIGS. 7 to 9, an inner surface of the protrusion 13a of the connector 10, that is, an inner surface in the space, which faces the protrusions 13b of the cover 10 and the base 11, is basically formed as a vertical surface 21 as illustrated in (a), and particularly, the inner surface of the protrusion is formed as an inclined surface 15 as illustrated in (b), such that an area on which the sealing member 14 is applied may be further widened, and as a result, the sealing section may be enlarged, thereby contributing to stable sealing quality.

In addition, even in the case of the protrusions 13b of the cover 100 and the base 11, inner surfaces in the spaces, which face the protrusion 13a of the connector 10, are also formed as a curved surface 16, thereby preventing an overflow of the sealing member 14 and providing larger sealing sections.

As an example of enlarging the sealing sections, as illustrated in (c), the surfaces at the connector side and the surfaces at the cover side and the base side, which face each other in the spaces that are formed between the protrusion 13a of the connector 10 and the protrusions 13b of the cover 10 and the base 11, are formed as recessed portions 17, such that larger areas on which the sealing member is applied may be secured, and as a result, the sealing sections may be enlarged.

In this case, the recessed portion 17 may be formed in any one of or both the surfaces at the connector side and the surfaces at the cover side and the base side.

Meanwhile, the present invention provides an effective sealing structure between the cover 10 and the base 11 in addition to the tight sealing structure between the connector 12, and the cover 10 and the base 11.

To this end, a groove 18a and a projection 18b, which may be fitted with each other, are formed at edges where the cover 10 and the base 11 come into contact with each other, for example, edges of the rear end portions and remaining both side portions except for the edges of the front end portions that come into contact with the connector side, and the sealing member 14 is applied at a binding region between the groove 18a and the projection 18b, which are formed as described above, such that sealing is made between the cover 10 and the base 11.

In this case, the groove 18a and the projection 18b are formed to be continuous along the edges, and therefore, the sealing member 14 applied on the groove 18a and the projection 18b seals the entire outer periphery where the cover 10 and the base 11 are coupled to each other, such that the coupling region between the cover 10 and the base 11 may also form a perfect sealing structure similar to the sealing structure with the connector side.

Therefore, according to the electronic control device provided by the present invention, by stable sealing such as the sealing which is made between the connector side, and the cover side and the base side using the sealing structure at the portion where the surfaces meet together, and the sealing which is made between the cover side and the base side using the sealing structure between the grooves, overall waterproof performance may be improved.

As such, the present invention implements a new sealing structure in which sealing is made at portions where surfaces of the cover and the base meet the surfaces of the connector, thereby achieving stable sealing quality because of an enlarged sealing section, and adopts a manner in which the protrusions are disposed at portions where the sealing member spreads when the sealing member is applied thereon, thereby improving quality of products.

The invention claimed is:

1. An electronic control device for a vehicle, which has an electronic control element that electrically controls each part of a vehicle, comprising:
   a cover and a base which accommodate the electronic control element; and
   a connector which is coupled to front surfaces of the cover and the base,
   wherein a protrusion of the connector is formed along an outer periphery of a rear end portion of the connector and protrusions of the cover and the base are formed along inner peripheries of front end portions of the cover and the base which come into contact with the outer periphery of the rear end portion of the connector, the protrusion of the connector and the protrusions of the cover and the base maintain predetermined gap, and a sealing member is applied in the gap such that sealing is made at portions where surfaces of the cover and the base meet surfaces of the connector, and
   wherein at least one surface of the connector and the cover, which face each other into the gap that is formed between the protrusion of the connector and the protrusion of the cover is formed as a recessed portion.

2. The electronic control device of claim 1, wherein the protrusion of the connector is formed as an inclined surface which faces the protrusions of the cover and the base.

3. The electronic control device of claim 1, wherein the protrusions of the cover and the base are formed as curved surfaces which face the protrusion of the connector.

4. The electronic control device of claim 2, wherein sealing between the cover and the base is made by using a groove and a projection, which are formed along edges where the cover and the base come into contact with each other, and by the sealing member that is applied in the groove and the projection.

5. The electronic control device of claim 1, wherein sealing between the cover and the base is made by using a groove and a projection, which are formed along edges where the cover and the base come into contact with each other, and by the sealing member that is applied in the groove and the projection.

6. The electronic control device of claim 2, wherein the protrusions of the cover and the base are formed as curved surfaces which face the protrusion of the connector.

7. The electronic control device of claim 2, wherein at least one surface of the connector and the base, which face each other into the gap that is formed between the protrusion of the connector and the protrusion of the cover and the base is formed as a recessed portion.

* * * * *